United States Patent
Lundberg (10) Patent No.: US 7,812,662 B2
(45) Date of Patent: Oct. 12, 2010

(54) SYSTEM AND METHOD FOR ADJUSTING SUPPLY VOLTAGE LEVELS TO REDUCE SUB-THRESHOLD LEAKAGE

(75) Inventor: James R. Lundberg, Austin, TX (US)

(73) Assignee: VIA Technologies, Inc., Taipei (TW)

( * ) Notice: Subject to any disclaimer, the term of this patent is extended or adjusted under 35 U.S.C. 154(b) by 53 days.

(21) Appl. No.: 12/247,008

(22) Filed: Oct. 7, 2008

(65) Prior Publication Data

US 2010/0085108 A1 Apr. 8, 2010

(51) Int. Cl.
*H03K 3/01* (2006.01)
(52) U.S. Cl. .......................... 327/534; 327/535
(58) Field of Classification Search .................. 327/534, 327/535, 537, 544
See application file for complete search history.

(56) References Cited

U.S. PATENT DOCUMENTS

| | | | |
|---|---|---|---|
| 5,557,231 A | 9/1996 | Yamaguchi et al. | |
| 6,630,857 B2 * | 10/2003 | Mizuno et al. | 327/534 |
| 6,696,865 B2 | 2/2004 | Horiguchi et al. | |
| 6,744,301 B1 | 6/2004 | Tschanz et al. | |
| 6,778,002 B2 * | 8/2004 | Miyazaki et al. | 327/534 |
| 6,833,748 B2 * | 12/2004 | Cho | 327/374 |
| 6,861,739 B1 * | 3/2005 | Bhavnagarwala et al. | 257/691 |
| 6,943,613 B2 * | 9/2005 | Miyazaki et al. | 327/534 |
| 6,967,522 B2 | 11/2005 | Chandrakasan et al. | |
| 6,977,519 B2 * | 12/2005 | Bhavnagarwala et al. | 326/34 |
| 7,123,076 B2 * | 10/2006 | Hatakeyama et al. | 327/534 |
| 7,161,408 B2 | 1/2007 | Mizuno et al. | |
| 7,164,307 B2 | 1/2007 | Tschanz et al. | |
| 7,245,177 B2 * | 7/2007 | Fujita et al. | 327/543 |
| 2003/0025552 A1 * | 2/2003 | Kusumoto et al. | 327/544 |
| 2003/0102903 A1 * | 6/2003 | Cho | 327/544 |
| 2005/0218965 A1 * | 10/2005 | Mizuno et al. | 327/534 |
| 2008/0052549 A1 * | 2/2008 | Ichien et al. | 713/322 |
| 2008/0116956 A1 * | 5/2008 | Teramoto et al. | 327/534 |

* cited by examiner

*Primary Examiner*—Lincoln Donovan
*Assistant Examiner*—Thomas J Hiltunen
(74) *Attorney, Agent, or Firm*—Gary R. Stanford; James W. Huffman (57) ABSTRACT

A voltage regulation module which includes an adjustable voltage which reduces the positive supply voltage and increases the negative supply voltage during a lower power mode. The voltage regulation module includes a voltage generator which provides an N-type substrate bias voltage at the normal operating voltage level of the positive supply voltage and which provides a P-type substrate bias voltage at the normal operating voltage level of the negative supply voltage during the lower power mode. Thus, the supply voltage levels are adjusted rather than the substrate bias voltages during the lower power mode. The voltage generator may be implemented as a voltage regulator, or may be implemented as a bias generator or charge pump or the like.

7 Claims, 5 Drawing Sheets

SYSTEM AND METHOD FOR ADJUSTING SUPPLY VOLTAGE LEVELS TO REDUCE SUB-THRESHOLD LEAKAGE

BACKGROUND OF THE INVENTION

1. Field of the Invention

The present invention relates to substrate biasing of semiconductor devices to reduce sub-threshold leakage, and more particularly to a system and method for adjusting supply voltage levels to reduce sub-threshold leakage.

2. Description of the Related Art

Complementary Metal-Oxide Semiconductor (CMOS) circuitry dissipates less power and is more dense than other types of integrated circuit (IC) technologies so that CMOS technology has become the dominant style of digital circuit design for integrated circuits. CMOS circuits use a combination of N channel (NMOS) and P channel (PMOS) devices each having a threshold gate-to-source voltage based on design, scale, materials and process. As IC design and fabrication techniques continue to evolve, operating voltages and device sizes have each scaled downward. The 65 nanometer (65 nm) process is an advanced lithographic process used for volume CMOS semiconductor fabrication and is particularly advantageous for Very Large Scale Integrated (VLSI) circuits, such as microprocessors and the like. As device sizes and voltage levels have decreased, the channel lengths and oxide thicknesses of each device have also decreased. Manufacturers have also switched to gate materials causing lower voltage thresholds which has further led to increased sub-threshold leakage current. Sub-threshold leakage current is the current that flows between the drain and source when the gate-to-source voltage is below the threshold voltage of the CMOS device. In many conventional circuits the substrate interface of each CMOS device, also referred to as the well or bulk tie, is coupled to a corresponding one of the supply voltage rails (e.g., PMOS bulk tied to VDD and NMOS bulk tied to VSS). In such conventional configurations the sub-threshold leakage current may account for nearly 30% or more of total power consumption in the dynamic environment (e.g., during normal operation).

It is often desired to operate an IC in a lower power mode (e.g., sleep or hibernation mode) and reduce power consumption as much as possible. As one skilled in the art will appreciate, increasing the threshold voltage of a CMOS device results in decreased leakage current. And since threshold voltage is proportional to the square root of the value of the drain-to-source voltage of the device, an increase in this drain-to-source voltage results in an increase in threshold voltage, thus resulting in a lower leakage current. Accordingly, in certain configurations a bias generator or charge pump is provided on the chip die and is used to bias device substrates to a voltage level other than the power supply voltages during low power mode. In particular, the charge pump raises the bulk tie of PMOS devices above VDD and lowers the voltage of the bulk tie of NMOS devices below VSS. Such substrate biasing significantly reduces the sub-threshold leakage current during low power mode thereby conserving a substantial amount of power. Charge pump circuits or the like are typically used to increase the substrate (bulk tie) voltage of P-channel devices above the positive supply voltage and to reduce the substrate voltage of N-channel devices below the negative supply voltage. The charge pump solution, however, presents certain inefficiencies by increasing the overall voltage range beyond the supply voltage range between VDD and VSS.

SUMMARY OF THE INVENTION

A voltage regulation module according to one embodiment includes an adjustable voltage regulator and a voltage generator. The adjustable voltage regulator has first and second outputs providing a positive supply voltage and a negative supply voltage, respectively, and further has a mode control input for receiving a mode select signal. The adjustable voltage regulator asserts the positive supply voltage at a first core voltage level and the negative supply voltage at a second core voltage level when the mode select signal indicates a higher power state. The adjustable voltage regulator reduces the positive supply voltage and increases the negative supply voltage when the mode select signal indicates a lower power state. The voltage generator provides an N-type substrate bias voltage at the first core voltage level and provides a P-type substrate bias voltage at the second core voltage level during the lower power state.

The voltage generator may be implemented in any suitable manner, such as a voltage regulator or a bias generator or a charge pump or the like. In one embodiment, the voltage generator is a voltage regulator which provides and maintains the N-type substrate bias voltage at the first core voltage level and which provides and maintains the P-type substrate bias voltage at the second core voltage level during each of the higher and lower power states. In alternative embodiments, the voltage generator is a bias generator which adjusts the modified supply voltages by suitable offsets to maintain relatively constant substrate bias voltages.

A printed circuit board according to one embodiment includes a processing module and a voltage regulator module. The processing module includes a positive supply voltage input, a negative supply voltage input, a P-type substrate bias voltage input, an N-type substrate bias voltage input, and a voltage control output providing a voltage control signal indicating either one of a higher power mode and a lower power mode. The voltage regulator module includes an adjustable voltage regulator and a voltage generator. The adjustable voltage regulator reduces the positive supply voltage and increases the negative supply voltage during a lower power mode. The voltage generator maintains the substrate bias voltages at the normal operating supply voltages during the lower power mode. The voltage generator may be configured as a voltage regulator or as a bias generator or charge pump or the like.

A method of biasing substrates of semiconductor devices of a processing module according to one embodiment includes providing a positive supply voltage at a positive core voltage level and providing a negative supply voltage at a negative core voltage level to provide power to the processing module during a higher power state, reducing the positive supply voltage and increasing the negative supply voltage during a lower power state, providing an N-type substrate bias voltage at the positive core voltage level to the processing module for biasing P-channel devices of the processing module during the lower power state, and providing a P-type substrate bias voltage at the negative core voltage level to the processing module for biasing N-channel devices of the processing module during the lower power state.

The method may include reducing the positive power supply voltage by a first offset voltage and increasing the negative power supply voltage by a second offset voltage.

The method may include adding the first offset voltage to the reduced positive power supply voltage to provide a preliminary N-type substrate bias voltage during the lower power state, subtracting the second offset voltage to the increased negative power supply voltage to provide a preliminary P-type substrate bias voltage during the lower power state, selecting the positive power supply voltage as the N-type substrate bias voltage and selecting the negative power supply voltage as the P-type substrate bias voltage during the higher power state, and selecting the preliminary N-type substrate bias voltage as the N-type substrate bias voltage and selecting the preliminary P-type substrate bias voltage as the P-type substrate bias voltage during the lower power state.

The method may include charging a first offset voltage added to the reducing positive supply voltage to provide and maintain the N-type substrate voltage at the positive core voltage level while reducing the positive supply voltage, and charging a second offset voltage subtracted from the increasing negative supply voltage to provide and maintain the P-type substrate voltage at the negative core voltage level while increasing the negative supply voltage.

The method may include providing the N-type substrate bias voltage at the positive core voltage level to the processing module during the higher power state and maintaining voltage of the N-type substrate bias voltage during the lower power state, and providing the P-type substrate bias voltage at the negative core voltage level to the processing module during the higher power state and maintaining voltage of the P-type substrate bias voltage during the lower power state.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventors have determined the need for reducing sub-threshold current leakage in a functional block of a device when the functional block is shut down or otherwise placed in a lower power mode. They have therefore developed a system and method for adjusting supply voltage levels to reduce sub-threshold leakage, as will be further described below with respect to FIGS. 1-5.

Figure 1:
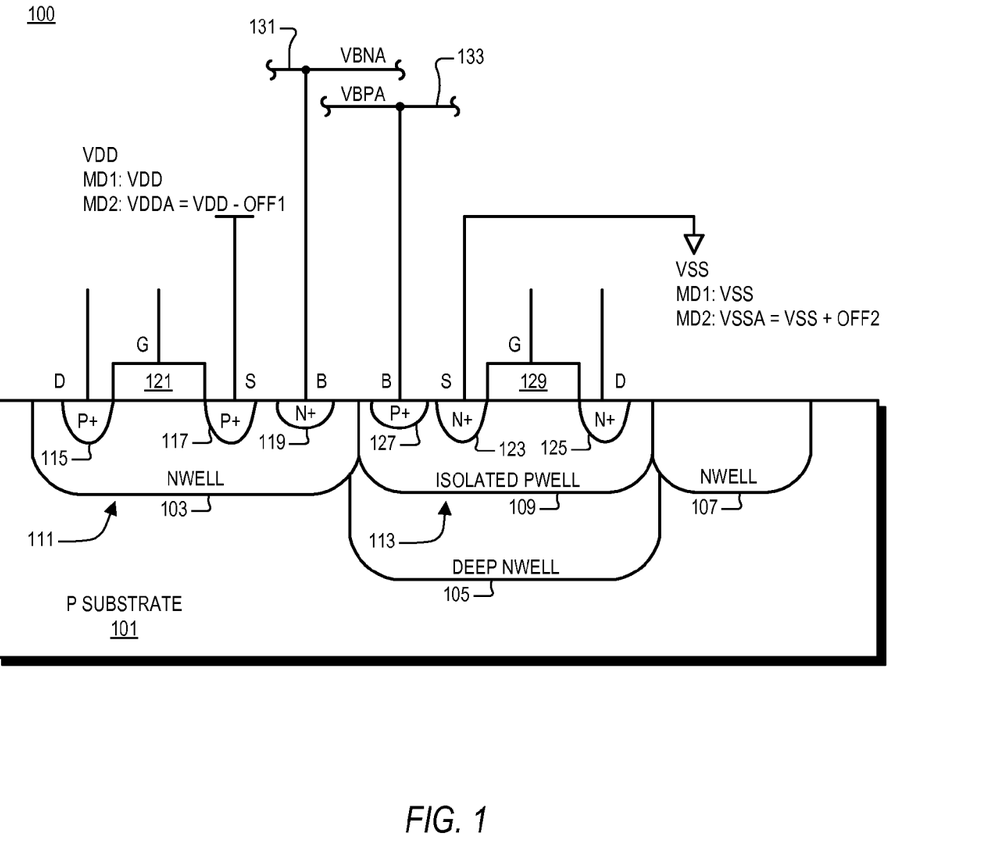
FIG. 1 is a figurative diagram of an integrated circuit (IC) including exemplary CMOS devices integrated onto a P substrate, and further showing substrate bias rails integrated onto the IC for biasing the substrates of the CMOS devices according to an exemplary embodiment.

FIG. 1 is a figurative diagram of an integrated circuit (IC) 100 including exemplary CMOS devices integrated onto a P substrate 101, and further showing substrate bias rails 131 and 133 integrated onto the IC 100 for biasing the substrates of the CMOS devices. The particular device configuration shown is referred to as the "twin-well" process although other types of processes are contemplated, such as N-well, P-well, triple-well, etc. Several N-type well (NWELL) regions 103, 105 and 107 are formed within the bulk P-substrate 101 in which the NWELL region 105 is a deep NWELL region. An isolated P-type well (PWELL) region 109 is formed within the deep NWELL region 105. The first NWELL region 103 is used to fabricate a P-channel device 111 and the isolated PWELL region 109 is used to fabricate an N-channel device 113. The third NWELL region 107 may be used to implement another device as understood by those skilled in the art and is not further described herein. Although only two devices 111 and 113 are shown and described, it is understood that any number of additional devices may be implemented on the P substrate 101.

A pair of P-type diffusion regions (P+) 115 and 117 and an N-type diffusion region (N+) 119 are formed within the NWELL region 103 of the P-channel device 111. The P-channel device 111 further includes a gate insulator layer 121 formed on the NWELL region 103 overlapping the P-type diffusion regions 115 and 117. The P+ region 115 forms the drain terminal, denoted "D", the P+ region 117 forms the source terminal, denoted "S", and the gate insulator 121 forms the gate terminal, denoted "G", of the P-channel device 111. The gate and drain terminals of the P-channel device 111 are coupled to corresponding signals (not shown) on the IC 100 depending upon the particular function of the device. The source terminal of the P-channel device 111 is shown coupled to a positive supply voltage VDD. The N+ region 119 forms a well or bulk connection, denoted "B", which is coupled to the substrate bias rail 131 providing a substrate bias voltage VBNA for P-channel devices. For the N-channel device 113, a pair of N-type diffusion regions (N+) 123 and 125 and a P-type diffusion region (P+) 127 are formed within the isolated PWELL region 109 and a gate insulator layer 129 is formed on the PWELL region 109 overlapping the N-type diffusion regions 123 and 125. The N+ region 125 forms the drain terminal D, the N+ region 123 forms the source terminal S, and the gate insulator 129 forms the gate terminal G. The gate and drain terminals of the N-channel device 113 are coupled are coupled to corresponding signals (not shown) on the IC 100 depending upon the particular function of the device. The source terminal of the N-channel device 113 is shown coupled to a negative supply voltage VSS, which is typically a reference voltage level such as signal ground or the like. The P+ region 127 forms a well or bulk connection B which is shown coupled to the substrate bias rail 133 providing a substrate bias voltage VBPA for N-channel devices.

It is understood that the supply voltages VDD and VSS are provided throughout an IC or chip using conductors or conductive traces or the like, such as conductive vias, conductive nodes, conductive rails, conductive buses or bus signals and the like as known to those skilled in the art. The supply voltages VDD and VSS are typically asserted at positive and negative core voltage levels, respectively, during the normal or higher power operating mode. The substrate bias voltage rails 131 and 133 are also implemented as conductors or conductive traces or the like.

The IC 100 is configured to operate in multiple power modes including a dynamic mode for normal operation at a higher power level and at least one lower power mode. In the dynamic mode, which is referred to herein as the first mode or "MD1", the voltage of VBNA on the substrate bias rail 131 is driven to the same voltage level of VDD and the voltage of VBPA on the substrate bias rail 133 to is driven the same voltage level of VSS. Thus, during normal dynamic mode operation, the bulk of the P-channel device 111 is driven to VDD and the bulk of the N-channel device 113 is driven to VSS. Although a significant level of sub-threshold leakage current flows reducing power efficiency somewhat, the devices 111 and 113 operate at their optimal performance levels providing an acceptable trade-off. In one lower power mode, referred to herein as the second mode or "MD2", the voltage of VDD is reduced by a first offset voltage amount OFF1 to a lower voltage level VDDA and the voltage of VSS is increased by a second offset voltage amount OFF2 to a higher voltage level VSSA. Furthermore, the voltage levels of VBNA and VBPA remain substantially unmodified during the lower power mode. In this manner, the level of sub-threshold leakage current is minimized since VBNA is higher than VDD (while VDD is reduced to VDDA=VDD−OFF1) and VBPA is lower than VSS (while VSS is increased to VSSA=VSS+OFF2).

In conventional configurations, VDD remains substantially unmodified or is otherwise reduced by a relatively modest amount and VSS remains unmodified in the low power mode. Furthermore, VBNA is increased by the offset voltage while VBPA is driven below VSS by the offset voltage to minimize sub-threshold leakage current during the low power mode. In this manner, the voltage difference between VBNA and VBPA is increased above the normal operating voltage difference between the core voltage levels of VSS and VDD and VBNA must be driven above the operating level of VDD. In the embodiment illustrated by the IC 100, VDD is reduced and VSS is increased to minimize sub-threshold leakage current while minimizing power consumption. When it is desired to switch from the lower power mode back to the normal operating mode, the positive and negative supply voltages VDD and VSS are simply driven back to their normal operating voltage levels.

Figure 2:
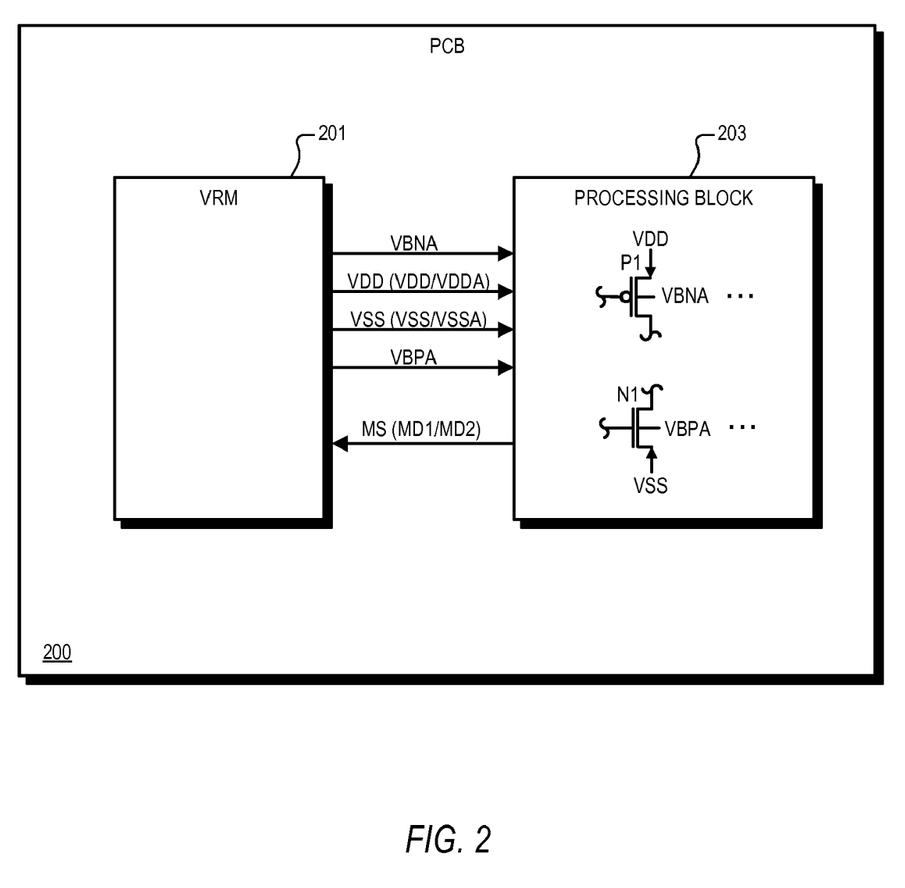
FIG. 2 is a simplified block diagram of a printed circuit board (PCB) including a voltage regulator module (VRM) implemented according to one embodiment.

FIG. 2 is a simplified block diagram of a printed circuit board (PCB) 200 including a voltage regulator module (VRM) 201 implemented according to one embodiment. The VRM 201 and a processing block 203 are both mounted on the PCB 200, such as a motherboard or the like as understood by those of ordinary skill in the art. The processing block 203 represents any type functional module or circuit, such as a processor or microprocessor or the like, which includes semiconductor devices with corresponding substrate connections similar to the CMOS devices 111 and 113 previously described. As shown, for example, the processing block 203 includes a P-channel device P1 having its source coupled to VDD and its bulk tie coupled to VBNA, and further includes an N-channel device N1 having its source coupled to VSS and its bulk tie coupled to VBPA. Ellipses adjacent P1 and N1 indicate that the processing block 203 may include any number of semiconductor devices with corresponding bulk tie connections. The VRM 201 provides the voltages VBNA, VDD, VSS and VBPA to the processing block 203, and the processing block 203 provides a mode select (MS) signal to the VRM 201.

The MS signal indicates any one of multiple operating modes of the processing block 203, where the operating modes at least include the dynamic normal mode MD1 and the lower power mode MD2. The MS signal is shown as one signal although it is understood that the MS signal may be implemented as a collective group of signals. In one embodiment, for example, the processing block 203 is a microprocessor providing a multi-bit voltage identification digital (VID) signal indicative of the desired operating supply voltage of VDD as known to those skilled in the art. The VRM 201 provides the supply voltages VDD and VSS at voltage levels determined by the MS signal. As previously described, the VRM 201 outputs VDD at the normal operating level for operating mode MD1 and reduces VDD to the voltage level VDDA for operating mode MD2. Similarly, the VRM 201 outputs VSS at the normal operating level for operating mode MD1 and increases VSS to the voltage level VSSA for operating mode MD2. Thus, the processing block 203 asserts the MS signal to indicate the lower power operating mode MD2 to minimize sub-threshold leakage current.

Figure 3:
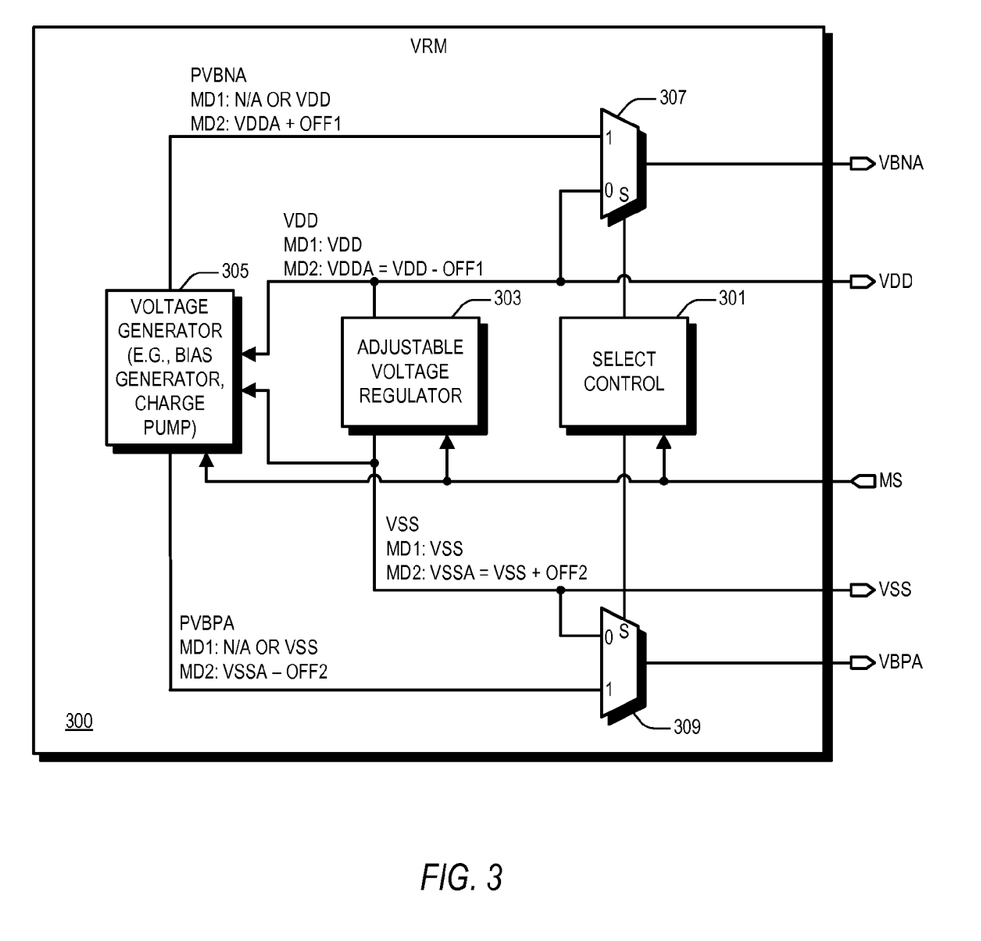
FIG. 3 is a block diagram of a VRM implemented according to one embodiment which may be used as the VRM of FIG. 2.

FIG. 3 is a block diagram of a VRM 300 implemented according to one embodiment which may be used as the VRM 201. The VRM 300 includes select control logic 301, an adjustable voltage regulator 303, and a voltage generator 305, each having an input receiving the MS signal. The voltage regulator 303 has a pair of outputs providing the VDD and VSS supply voltages and the voltage generator 305 has a pair of outputs providing preliminary VBNA and VBPA voltages, shown as PVBNA and PVBPA, respectively. The VRM 300 also includes a first multiplexer (MUX) 307 having a logic one (1) input receiving the PVBNA voltage, a logic zero (0) input receiving the VDD signal, an output providing the VBNA voltage and a select (S) input. The VRM 300 further includes a second MUX 309 having a logic one (1) input receiving the PVBPA voltage, a logic zero (0) input receiving the VSS voltage, an output providing the VBPA voltage and a select (S) input. The select control logic 301 has two outputs coupled to the respective select inputs of the MUXes 307 and 309. The select control logic 301 and the MUXes 307 and 309 collectively form selection logic for controlling the sources of the VBNA and VBPA voltages depending upon on the MS signal as further described below. The voltage generator 305 has a pair of inputs receiving the VDD and VSS voltages.

In the illustrated embodiment, the adjustable voltage regulator 303 is a voltage regulator as understood by those skilled in the art which is designed to maintain the voltage levels of VDD and VSS within predetermined or specified voltage ranges during various load conditions. As shown in FIG. 2, for example, the processing block 203 may be a microprocessor or the like which may demand a significant level of power during the normal operating mode. The conductors or traces carrying the supply voltages VDD and VSS are configured accordingly to carry the desired current levels as understood by those skilled in the art. In one embodiment, the VBNA and VBPA voltages, by contrast, are not as strictly controlled and may vary within somewhat larger voltage ranges. Also, the VBNA and VBPA voltages provide significantly less lower power at reduced current levels and need only maintain a suitable voltage offsets relative to VDD and VSS to reduce sub-threshold leakage currents to acceptable levels. In one embodiment, the voltage generator 305 is implemented as a bias generator or a suitable charge pump or the like.

When the MS signal indicates the normal dynamic operating mode MD1, the voltage regulator 303 asserts the supply voltages VDD and VSS to normal operating or core voltage levels for providing full power to external devices. In the MD1 operating mode, the voltage generator 305 is either turned off so that its outputs are not applicable (N/A), or otherwise passes the VDD voltage as the PVBNA voltage and passes the VSS voltage as the PVBPA voltage. For the MD1 operating mode, the select control logic 301 controls the MUXes 307 and 309 to each select their logic zero inputs so that the VBNA voltage is asserted at the same voltage level as VDD and so that the VBPA voltage is asserted at the same voltage level as VSS. In this manner during the normal dynamic operating mode MD1, VBNA and VDD are both asserted at the same voltage level and VBPA and VSS are both asserted at the same voltage level.

When the MS signal indicates the lower power mode MD2, the voltage regulator 303 reduces VDD by the first offset voltage amount OFF1 to the lower voltage level VDDA, and increases VSS by the second offset voltage amount OFF2 to the higher voltage level VSSA. The voltage generator 305 receives VDD at the reduced voltage level VDDA and adds the first offset voltage amount OFF1 to VDDA to provide the PVBNA voltage, so that PVBNA stays at about the same voltage level as the normal voltage level of VDD. Similarly, the voltage generator 305 receives VSS at the increased voltage level VSSA and subtracts the second offset voltage amount OFF2 from VSSA to provide the PVBPA voltage, so that PVBPA stays at about the same voltage level as the normal voltage level of VSS. The select control logic 301 controls the MUXes 307 and 309 to each select their logic one inputs to select PVBNA as VBNA and to select PVBPA as VBPA, so that the VBNA and VBPA voltages remain at the normal core voltage levels of VDD and VSS, respectively. In other words, while the voltage of VDD is reduced and the voltage of VSS is increased, the voltages of VBNA and VBPA remain substantially unchanged after switching to the lower power mode.

When the MS signal is switched from indicating mode MD2 back to indicating mode MD1, the voltage regulator 303 increases the voltage of VDD from VDDA back to its original voltage level and decreases VSS from VSSA back to its original voltage level. In one embodiment, as the voltage regulator 303 increases VDD back to its original voltage level, the voltage generator 305 reduces the offset applied until PVBNA also stabilizes at the original voltage level of VDD. Also, as the voltage regulator 303 decreases VSS back to its original voltage level, the voltage generator 305 reduces the offset applied until PVBPA also stabilizes at the original voltage level of VSS. Upon reaching stabilization, the select control logic 301 switches state of the MUXes 307 and 309 back to selecting their logic zero inputs for the normal operating mode. Although the select control logic 301 may switch the MUXes 307 and 309 sooner, it may not be desired to switch back to the VDD/VSS inputs before they have stabilized back to their original voltage levels since otherwise the VBNA voltage would momentarily decrease and the VBPA voltage would momentarily increase until stabilization is reached.

Referring back to the PCB 200, when the processing block 203 asserts the MS signal to indicate the normal dynamic mode MD1, VDD and VBNA are the same voltage which is the normal core voltage of VDD and VSS and VBPA are the same voltage which is the normal core voltage of VSS to enable optimal performance of the processing block 203. When the processing block 203 asserts the MS signal to indicate the lower power mode MD2, VBNA remains substantially unchanged while the voltage of VDD is reduced to minimize the sub-threshold leakage current of P1 and other P-channel devices of the processing block 203. Likewise, VBPA remains substantially unchanged while the voltage of VSS is increased to minimize the sub-threshold leakage current of N1 and other N-channel devices of the processing block 203. If the processing block 203 asserts the MS signal back to indicate mode MD1, the VDD and VSS voltages are returned back to their normal levels whereas VBNA and VBPA remain substantially unmodified.

Figure 4:
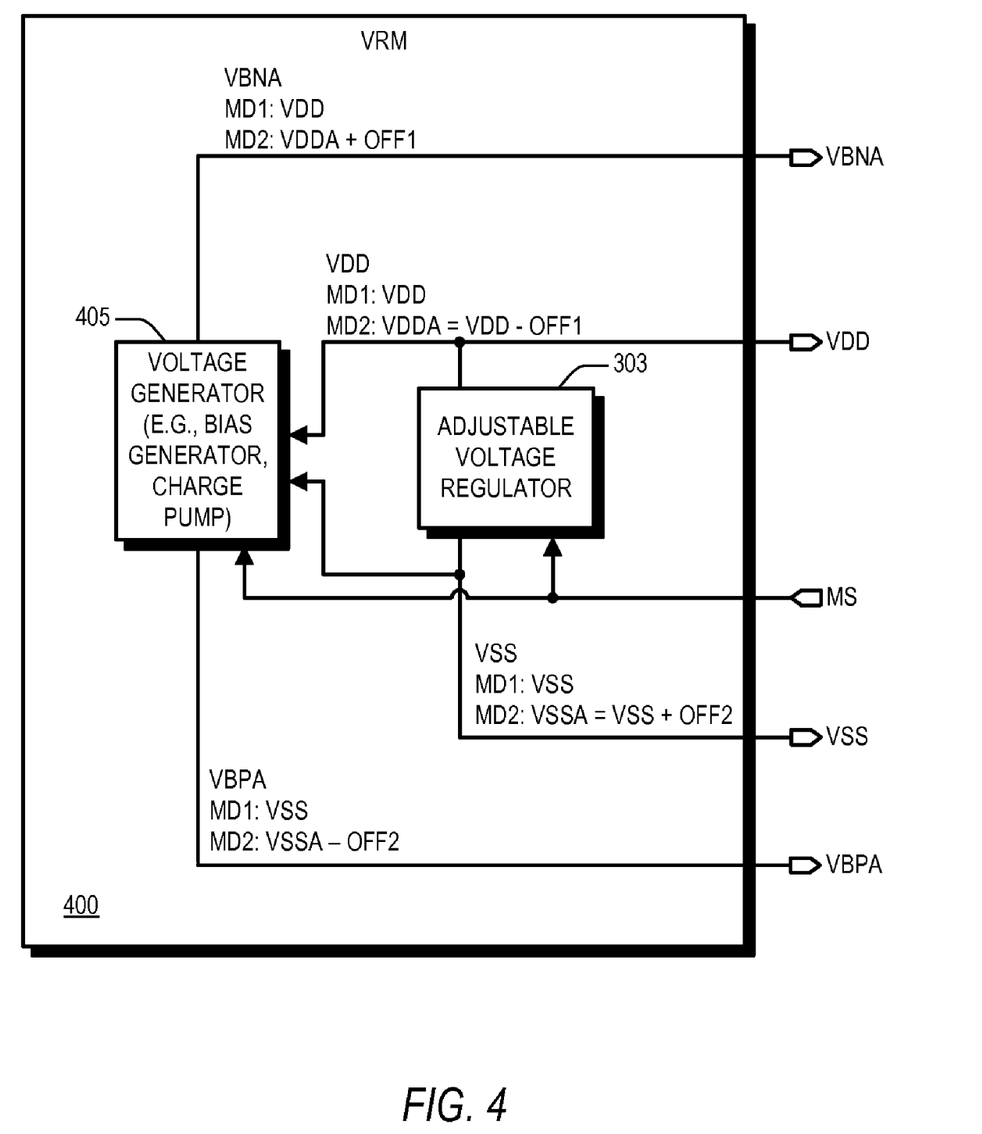
FIG. 4 is a block diagram of a VRM implemented according to another embodiment which may be used as the VRM of FIG. 2.

FIG. 4 is a block diagram of a VRM 400 implemented according to another embodiment which may be used as the VRM 201. The VRM 400 is similar to the VRM 300 in which the adjustable voltage regulator 303 is included and operates in the same manner as previously described. The select control logic 301 and the MUXes 307 and 309 are omitted and a voltage generator 405 replaces the voltage generator 305. The voltage generator 405 is similar to the voltage generator 305 except that the voltage generator 405 provides the VBNA and VBPA voltages directly rather than through selection logic. Thus, in mode MD1 the voltage generator 405 asserts VBNA equal to VDD and asserts VBPA equal to VSS. In one embodiment, transitional operation of the voltage generator 405 is synchronized with transitional operation of the voltage regulator 303 to ensure that the voltages of VBNA and VBPA remain relatively constant during the transitions between the MD1 and MD2 operating modes. In one embodiment, for example, as the voltage regulator 303 increases (or decreases) VDD, the voltage generator 405 decreases (or increases) VBNA at about the same rate so that VBNA remains relatively constant. Furthermore, as the voltage regulator 303 increases (or decreases) VSS, the voltage generator 405 decreases (or increases) VBPA at about the same rate so that VBPA remains relatively constant. At least one advantage of the VRM 400 over the VRM 300 is the elimination of the selection logic.

Figure 5:
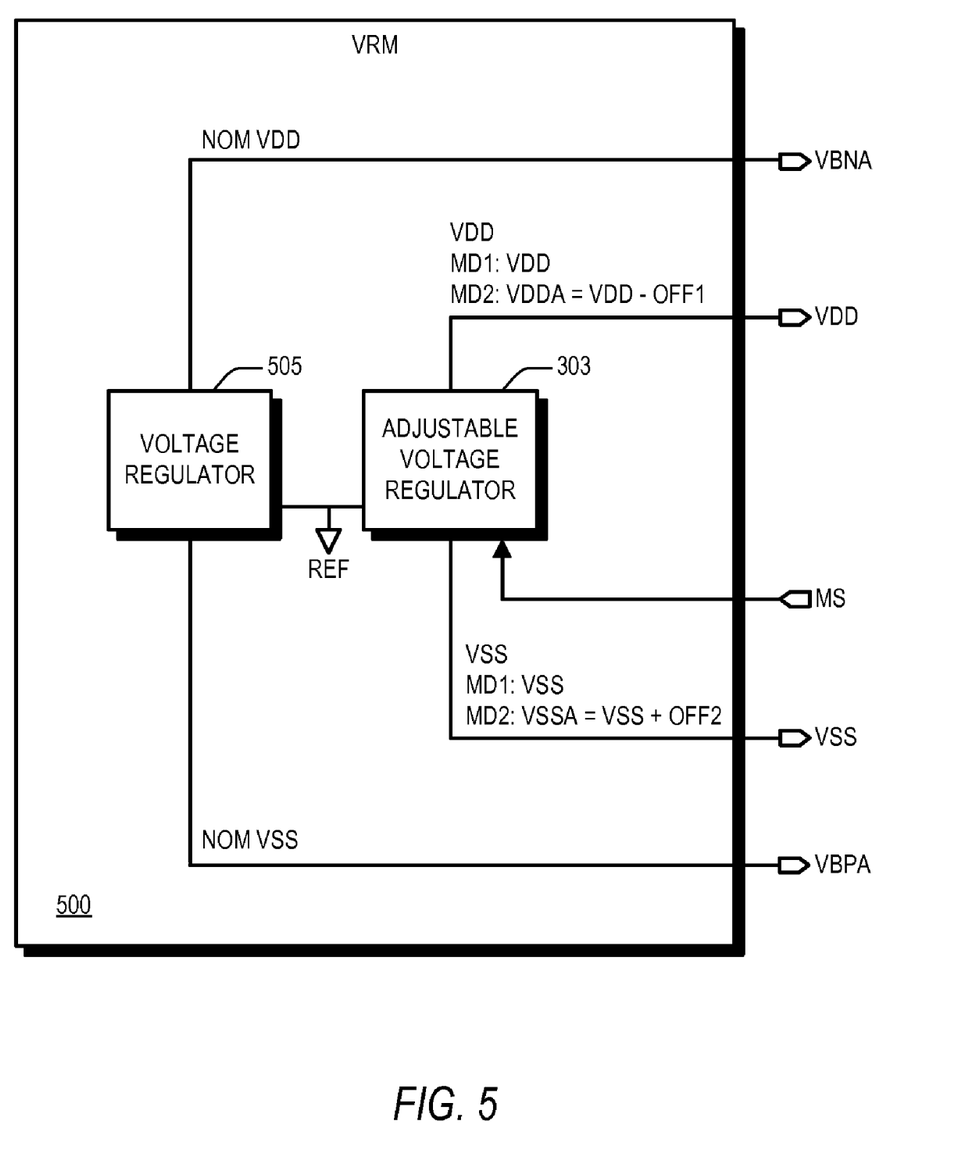
FIG. 5 is a block diagram of a VRM implemented according to another embodiment which may be used as the VRM of FIG. 2.

FIG. 5 is a block diagram of a VRM 500 implemented according to another embodiment which may be used as the VRM 201. The VRM 500 is similar to the VRM 400 in which the adjustable voltage regulator 303 is included and operates in the same manner as previously described. The voltage generator 405 is replaced with a voltage regulator 505, which directly provides the VBNA and VBPA voltages. In this case, the voltage regulator 505 maintains the VBNA and VBPA voltages at the nominal voltage levels of the supply voltages VDD and VSS during both modes MD1 and MD2. Thus, the MS signal is not provided to the voltage regulator 505. A reference voltage level REF is shown coupled to both of the voltage regulators 303 and 505, where REF is maintained at the nominal or normal core operating voltage of VSS. In this case REF is a reference ground level for both regulators. In this manner, VSS is asserted at the voltage level of REF during MD1 and is increased by OFF2 to VSSA during MD2. The voltage regulator maintains VBPA at REF and maintains VBNA at the normal core operating voltage of VDD (relative to REF) during both operating modes MD1 and MD2.

In a more specific configuration that may apply to any of the embodiments previously described, the supply voltages are such that VSS is approximately 0 Volts (V) and VDD is approximately 1V during normal operation. The offset voltages OFF1 and OFF2 are any voltages up to 800 millivolts (mV) relative to the corresponding supply voltage levels. In one embodiment, VDD decreases from 1V to 0.5V while VBNA remains at 1V, and VSS increases from 0V to 0.5V while VBPA remains at 0V during the lower power mode. It is understood that the actual supply voltages may vary depending upon the operating mode of the device. For example, VDD may range between approximately 500 mV to 1.4V in certain configurations or under certain conditions. And further, offset voltages OFF1 and OFF2 may be the same or different depending upon the particular implementation.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A voltage regulation module, comprising:
   an adjustable voltage regulator having first and second outputs providing a positive supply voltage and a negative supply voltage, respectively, and having a mode control input for receiving a mode select signal;
   wherein said adjustable voltage regulator asserts said positive supply voltage at a first core voltage level and said negative supply voltage at a second core voltage level when said mode select signal indicates a higher power state, and wherein said adjustable voltage regulator reduces said positive supply voltage and increases said negative supply voltage when said mode select signal indicates a lower power state;
   a bias generator which provides an N-type substrate bias voltage at said first core voltage level, which provides a P-type substrate bias voltage at said second core voltage level during said lower power state, wherein said bias generator has a first input receiving said positive supply voltage, a second input receiving said negative supply voltage, and a third input receiving said mode select signal;
   wherein said adjustable voltage regulator reduces voltage of said positive supply voltage by a first offset voltage to provide a reduced positive supply voltage and increases voltage of said negative supply voltage by a second offset voltage to provide an increased negative supply voltage during said lower power state; and
   wherein said bias generator adds said first offset voltage to said reduced positive supply voltage to provide said N-type substrate bias voltage during said lower power state and wherein said bias generator subtracts said second offset voltage from said increased negative supply voltage by to provide said P-type substrate bias voltage during said lower power state.

2. The voltage regulation module of claim 1, wherein said bias generator comprises a charge pump.

3. The voltage regulation module of claim 1, wherein said bias generator increases voltage added to said positive supply voltage being reduced at about the same rate as said adjustable voltage regulator reduces said positive supply voltage to maintain a constant voltage of said N-type substrate bias voltage, and wherein said bias generator decreases voltage subtracted from said increasing negative supply voltage at about the same rate as said adjustable voltage regulator increases said negative supply voltage to maintain a constant voltage of said P-type substrate bias voltage.

4. A printed circuit board, comprising:
   a processing module comprising a positive supply voltage input, a negative supply voltage input, a P-type substrate bias voltage input, an N-type substrate bias voltage input, and a voltage control output providing a voltage control signal indicating either one of a higher power mode and a lower power mode; and
   a voltage regulator module, comprising:
      an adjustable voltage regulator having a first output providing a positive supply voltage to said positive supply voltage input of said processing module, having a second output providing a negative supply voltage to said negative supply voltage input of said processing module, and having a voltage control input coupled to said voltage control output of said processing module for receiving said voltage control signal;
      wherein said adjustable voltage regulator asserts said positive supply voltage at a first core voltage level and said negative supply voltage at a second core voltage level when said voltage control signal indicates a higher power state, and wherein said adjustable voltage regulator reduces said positive supply voltage and increases said negative supply voltage when said voltage control signal indicates a lower power state;
      a bias generator having a first output providing an N-type substrate bias voltage at said first core voltage level, having a second output providing a P-type substrate bias voltage at said second core voltage level during said lower power state, having a first input receiving said positive supply voltage, having a second input receiving said negative supply voltage, and having a third input receiving said voltage control signal;
      wherein said adjustable voltage regulator reduces voltage of said positive supply voltage by a first offset voltage to provide a reduced positive supply voltage and increases voltage of said negative supply voltage by a second offset voltage to provide an increased negative supply voltage during said lower power state; and
      wherein said bias generator adds said first offset voltage to said reduced positive supply voltage to provide said N-type substrate bias voltage during said lower power state, and wherein said bias generator subtracts said second offset voltage from said increased negative supply voltage by to provide said P-type substrate bias voltage during said lower power state.

5. The printed circuit board of claim 4, wherein said bias generator comprises a charge pump.

6. The printed circuit board of claim 4, wherein said bias generator increases voltage added to said positive supply voltage at about the same rate as said adjustable voltage regulator reduces said positive supply voltage to maintain a constant voltage of said N-type substrate bias voltage, and wherein said bias generator decreases voltage subtracted from said negative supply voltage at about the same rate as said adjustable voltage regulator increases said negative supply voltage to maintain a constant voltage of said P-type substrate bias voltage.

7. A method of biasing substrates of semiconductor devices of a processing module, comprising:
   providing a positive supply voltage at a positive core voltage level and providing a negative supply voltage at a negative core voltage level to provide power to the processing module during a higher power state;

reducing the positive supply voltage and increasing the negative supply voltage during a lower power state;

providing an N-type substrate bias voltage at the positive core voltage level to the processing module for biasing P-channel devices of the processing module during the lower power state; and providing a P-type substrate bias voltage at the negative core voltage level to the processing module for biasing N-channel devices of the processing module during the lower power state;

while said reducing the positive supply voltage, charging a first offset voltage added to the reducing positive supply voltage to provide and maintain the N-type substrate voltage at the positive core voltage level; and while said increasing the negative supply voltage, charging a second offset voltage subtracted from the increasing negative supply voltage to provide and maintain the P-type substrate voltage at the negative core voltage level.

\* \* \* \* \*